United States Patent [19]

Hirano

[11] Patent Number: 4,486,720
[45] Date of Patent: Dec. 4, 1984

[54] PROTECTIVE CIRCUIT FOR POWER AMPLIFIER

[75] Inventor: Masahiro Hirano, Tokyo, Japan

[73] Assignee: Sony Corporation, Tokyo, Japan

[21] Appl. No.: 402,637

[22] Filed: Jul. 28, 1982

[30] Foreign Application Priority Data

Aug. 1, 1981 [JP] Japan ................................ 56-121107

[51] Int. Cl.³ ............................................. H02H 7/20
[52] U.S. Cl. .................................. 330/298; 330/295; 330/51
[58] Field of Search .................... 330/207 P, 298, 295, 330/51; 361/78, 86–88

[56] References Cited

U.S. PATENT DOCUMENTS 4,127,743 11/1978 Ozawa et al. .................. 330/298 X

FOREIGN PATENT DOCUMENTS 43-9401 4/1968 Japan ............................... 330/207 P Primary Examiner—James B. Mullins
Attorney, Agent, or Firm—Hill, Van Santen, Steadman & Simpson

[57] ABSTRACT

A protective circuit for a power amplifier includes an input terminal connected to the output terminal of a power amplifier to be protected and supplied with an output signal to a load from the power amplifier, a high frequency signal detector connected to the input terminal for detecting a higher frequency signal than that of audio frequency range and for producing a first control signal when the output of the high frequency signal exceeds a predetermined value, a control and driving circuit supplied with the first control signal, and a protective circuit controlled by the output of the control and driving circuit so as to disconnect the connection between the output terminal of the power amplifier and the load.

7 Claims, 3 Drawing Figures

PROTECTIVE CIRCUIT FOR POWER AMPLIFIER

BACKGROUND OF THE INVENTION

1. Field of the Invention

The present invention relates generally to a protective circuit for a power amplifier, and is directed more particularly to such a protective circuit for a power amplifier so as to protect the power amplifier from being damaged by a high frequency oscillation signal.

2. Description of the Prior Art

Recently, a power amplifier superior in high frequency characteristic has been proposed whose slew rate (voltage changing ratio of an amplified output when a rectangular wave is applied to the power amplifier) is 400 to 500 V/$\mu$sec, while that of a prior art power amplifier up to that time is 80 V/$\mu$sec. Such power amplifier amplifies the high frequency components of a signal with high fidelity, so that a sound can be reproduced without disturbing the fine sound quality.

There is danger that an oscillation may be caused in such power amplifier at a high frequency range due to a stray capacity. If such high frequency oscillation appears, the power amplifier per se and also a speaker driven thereby are some times damaged. That is, when an oscillation is generated at a relatively low frequency range, since the oscillations waveform is disturbed, DC components are generated and hence a DC protective circuit is operated to be able to avoid the generation of oscillation in the prior art. However, when the oscillation frequency is high, for example, about 1 MHz, the oscillation waveform becomes approximately a sine wave and hence no DC component is produced. Accordingly, the power amplifier can not be protected from the high frequency oscillation by only the prior art DC protective circuit.

When an oscillation is caused at high frequency, since through a transistor serving as an amplifying element of the power amplifier, a current continuously flows due to the stored charge at a high frequency, for example, about 1 MHz (upon high frequency, an oscillation loop is established by small stray capacity), there is a danger that the power amplifier may be damaged. Further, at this time since a large power is applied to a speaker, the speaker is also damaged.

The above will be now considered with a case as an example where a power amplifier is connected to a system selector. This system selector is formed of as shown in FIG. 1 change-over switches 1 and 2 and is used in, for example, an audio specialty store. In FIG. 1, references $3_1$, $3_2$, ... $3_n$ designate tuners (or record players) whose output terminals are respectively connected to input terminals or contacts $1_{a1}, 1_{a2}, \ldots 1_{an}$ of the change-over switch 1. Output terminals or contacts $1_{b1}, 1_{b2}, \ldots 1_{bn}$ of this change-over switch 1 are respectively connected to input terminals of amplifiers $4_1, 4_2, \ldots 4_n$ whose output terminals are respectively connected to input terminals or contacts $2_{a1}, 2_{a2}, \ldots 2_{an}$ of the change-over switch 2 output terminals or contacts $2_{b1}, 2_{b2}, \ldots 2_{bn}$ of which are connected to speakers $5_1, 5_2, \ldots 5_n$, respectively.

According to the above system selector, it is possible to connect the tuners $3_1$ to $3_n$, amplifiers $4_1$ to $4_n$ and speakers $5_1$ to $5_n$ in any desired combination by suitably switching over the change-over switches 1 and 2.

With such system selector, however, it is required frequently to have long connection cords and hence a stray capacity $C_F$ is formed as shown in FIG. 1 by the broken line resulting in the formation of an oscillation loop including the amplifiers $4_1$ to $4_n$. When the prior art amplifiers are used as the amplifiers $4_1$ to $4_n$, the oscillation frequency may be considered relatively low so that they can be of course protected by a DC protective circuit and so on. However, when the power amplifiers whose slew rate is as large as 400 to 500 V/$\mu$sec are used as the amplifiers $4_1$ to $4_n$, oscillation is caused at high frequency and troubles occur frequently, which is practically noted at present.

In order to avoid the generation of such oscillation, it is important that the cord is not unnecessarily long. It is however, sometimes appeared that the cord is moved temporarily or carelessly. In such case, if the amplifiers $4_1$ to $4_n$ and speakers $5_1$ to $5_n$ are damaged, it is very inconvenient. Therefore, it is desired that when high frequency oscillation is caused, the amplifiers $4_1$ to $4_n$ are made inoperative, and then the cord movement is made less so as to use the cord normally.

OBJECTS AND SUMMARY OF THE INVENTION

Accordingly, it is an object of the present invention to provide a protective circuit for a power amplifier free from the defects inherent to the prior art.

It is another object of the invention to provide a protective circuit for a power amplifier in which the muting of the power amplifier upon ON and OFF of power supply and the protection of the power amplifier from high frequency oscillation can be performed by means of a common relay.

In accordance with an aspect of the present invention, there is provided a protective circuit for a power amplifier which comprises:
 (a) an input terminal connected to an output terminal of a power amplifier to be protected and supplied with an output signal to a load from said power amplifier;
 (b) a high frequency signal detector connected to said input terminal and for detecting a higher frequency signal than that of audio frequency range and for producing a first control signal when the output of said high grequency signal exceeds a predetermined value;
 (c) control and driving means supplied with said first control signal from said high frequency signal detector; and
 (d) protective means controlled by the output of said control and driving means so as to disconnect the connection between said output terminal of said power amplifier and said load.

The other objects, features and advantages of the present invention will become apparent from the following description taken in conjunction with the accompanying drawings through which the like references designate the same elements and parts.

DESCRIPTION OF THE PREFERRED EMBODIMENTS

The present invention will be hereinbelow described with reference to the attached drawings.

Figure 1:
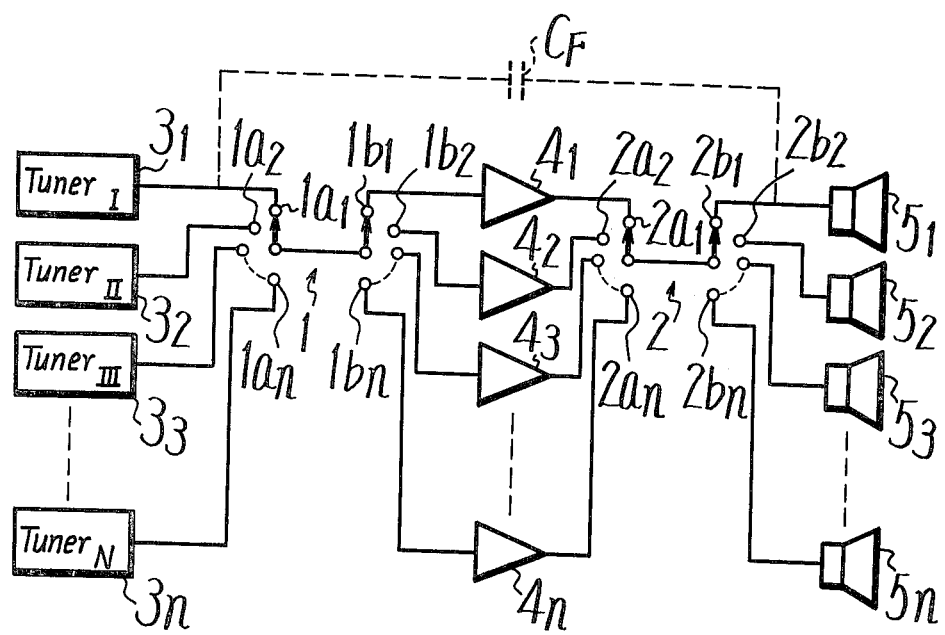
FIG. 1 is a circuit block diagram showing a prior art system selector.
Figure 2:
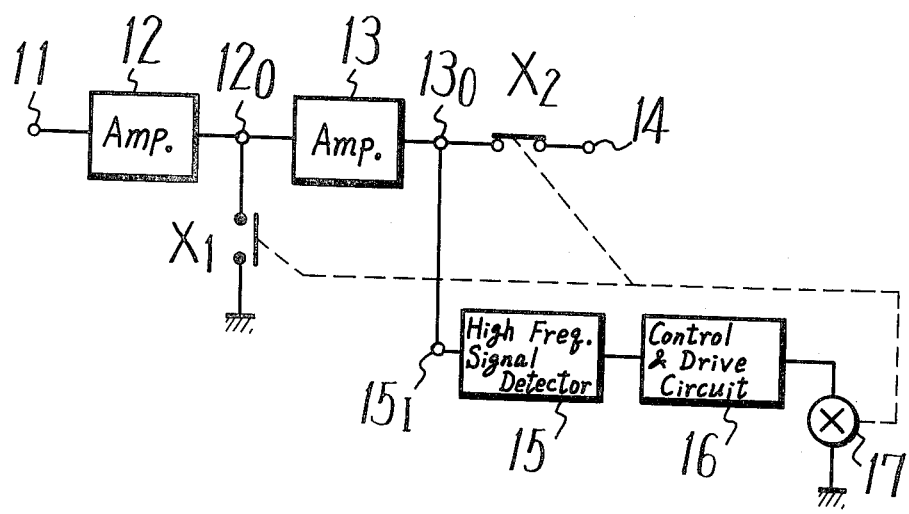
FIG. 2 is a circuit block diagram showing an example of the protective circuit for a power amplifier according to the present invention.

FIG. 2 shows in block an example of the protective circuit for a power amplifier according to the present invention. In this figure, reference numeral 11 designates an input terminal through which an audio signal is supplied to a pre-amplifier 12 whose output terminal $12_0$ is grounded through a normally open switch or contact $X_1$ of a relay device and is also connected to the input terminal of a power amplifier 13. An output terminal $13_0$ of this power amplifier 13 is connected to an output terminal 14 through a normally closed switch or contact $X_2$ of the relay device. Although not shown, a speaker is connected to the output terminal 14. The output terminal $13_0$ of the power amplifier 13 is also connected to an input terminal $15_I$ of a high frequency signal detector 15 which produces detected output when the high frequency signal higher than the audio frequency band range in the output signal from the power amplifier 13 exceeds a predetermined level. The detected output from the high frequency signal detector 15 is fed to a control and drive circuit 16. This control and drive circuit 16 functions such that when it is not supplied with the detected output or the input audio signal is normal, it energizes a coil 17 of the relay device to make the relay contact $X_1$ OFF while the relay contact $X_2$ ON. On the other hand, when the detected output appears from the high frequency signal detector 15 and is applied to the control and drive circuit 16, it stops the supply of power to the relay coil 17 to thereby make the contact $X_1$ ON while the contact $X_2$ OFF.

Figure 3:
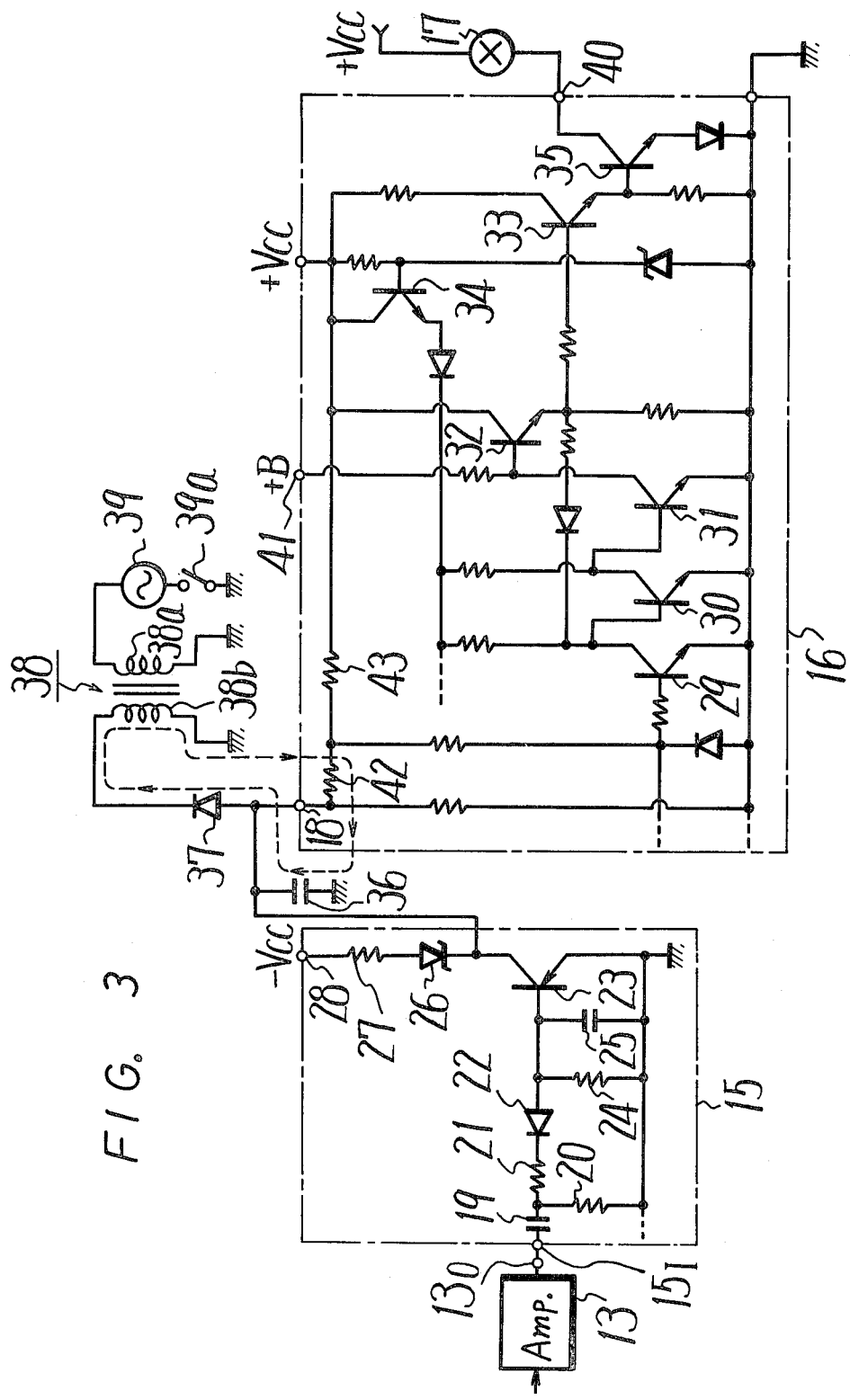
FIG. 3 is a circuit connection diagram showing another example of the invention.

As an example of the high frequency signal detector 15 and the control and drive circuit 16 shown in FIG. 2, those shown in FIG. 3 can be used by way of example. In the example of FIG. 3, an IC (integrated circuit) of a protective circuit for a general power amplifier is employed as the control and drive circuit 16. This IC protective circuit is so formed that it performs such functions to perform the detections of over load, temperature, output DC voltage or potential and AC signal and can make the power amplifier inoperative when they are detected as abnormal. The AC signal is detected when a commerical electric power supply is ON and OFF so as to mute the noise upon ON and OFF of the power supply. In the example of FIG. 3, an input terminal 18, to which the above detected output is supplied, is supplied with the high frequency signal detected output so as to use the control and drive circuit 16 as for preventing the high frequency oscillation and also for detecting the AC signal.

In detail, in the example of FIG. 3, the output terminal $13_0$ of the power amplifier 13 is grounded through the input terminal $15_I$ and a series circuit of a capacitor 19 and a resistor 20, the connection point between the capacitor 19 and the resistor 20 is connected through a resistor 21 to the cathode of a diode 22, and the anode thereof is connected to the base of a PNP-type transistor 23. The emitter of this transistor 23 is grounded, and a parallel circuit of a resistor 24 and a capacitor 25 is connected between the base and the emitter of the transistor 23. The collector of the transistor 23 is connected to the cathode of a Zener diode 26 whose anode is connected through a resistor 27 to a power supply terminal 28 of a negative voltage $-V_{cc}$, for example, $-55$ V. The collector of the transistor 23 is also connected to the input terminal 18 of the control and drive circuit 16.

In this case, the capacitor 19 and the resistor 20 form a high pass fillter through which a signal with the frequency higher than, for example, 100 kHz passes. The signal passed through the high pass filter is detected by the diode 22 and the base of the transistor 23 is supplied with the signal responsive to the level of the high frequency signal. At this time, the detected output is divided by the resistors 21 and 24 so that if the time constant of the resistors 21 and 24 is selected suitably, the ON-level of the transistor 23 can be adjusted. When the transistor 23 turns ON by the high frequency signal, the collector of the transistor 23, which is deeply biased in the negative direction, approaches a zero potential, for example, $-1$ V.

The control and drive circuit 16 is formed of a part of an ordinary IC protective circuit. That is, the control and drive circuit 16 consists of transistors 29, 30 and 31 each of which is of an emitter grounded type, transistors 32 and 33 each of which is of a voltage follower type, a transistor 34 which forms a constant current circuit, a drive transistor 35 and so on.

To the input terminal 18, connected are in addition to the collector of the transistor 223 mentioned above, one end of a capacitor 36 whose other end is grounded and the anode of a diode 37. The cathode of this diode 37 is connected to one end of a secondary winding 38b of a transformer 38 the other end of which is grounded. One end of a primary winding 38a of the transformer 38 is connected to a commercial AC electric power supply source 39, and the other end of the primary winding 38a of the transformer 38 is grounded.

In the control and drive circuit 16, its output terminal 40 is connected to one end of the relay coil 17 whose other end is connected to a power supply voltage $+V_{cc}$.

In case of the example shown in FIG. 3, when a power switch 39a of the commercial electric power supply source 39 is made ON, the relay coil 17 is energized, while the power switch 39a is made OFF, the energization of the relay coil 17 is stopped. When the power switch 39a is made ON and hence the commercial electric power supply source 39 is connected to the circuit, as shown in FIG. 3 by a broken line arrow, a rectified current flows through the closed circuit of the secondary winding 38b of the transformer 38, the capacitor 36 and the diode 37 whereby the capacitor 36 is charged. As a result, the input terminal 18 is deeply biased in the negative direction.

Thus, under such state, in the control and drive circuit 16, the transistor 29 becomes OFF. Therefore, the transistor 30 turns ON while the transistor 31 becomes OFF. As a result, at the emitter of the transistor 32, obtained is a voltage responsive to a bias voltage $+B$ at a bias voltage terminal 41. This voltage is applied through the voltage follower type transistor 33 to the base of the drive transistor 35. Thus, the transistor 35 turns ON and accordingly, the relay coil 17 is excited.

Next, when the power switch 39a is made OFF and hence the commercial electric power supply source 39 is disconnected from the circuit, the capacitor 36 is discharged and the potential at the input terminal 18 rises to, for example, $-1$ V. In this case, if the voltage dividing resistors 42 and 43, which are connected in series between the power supply source $+V_{cc}$ and the transistor 29, are selected desirably, a current flows to the base of the transistor 29 and hence it turns ON. As a result, the transistor 30 at the next stage becomes OFF and the transistor 31 at the next stage thereof becomes ON. Consequently, the transistors 32 and 33 both become OFF, and the drive transistor 35 becomes OFF also. Thus, the excitation of the relay coil 17 is stopped.

From the above explanation, it will be easily understood that also when the potential of −1 V is applied to the input terminal 18 as the detected output from the high frequency signal detector 15, the excitation of the relay coil 17 is stopped.

With the above circuit of the invention constructed as above, if an oscillation may occur by a high frequency signal of, for example, 1 MHz, the power amplifier 13, of course, delivers a high frequency signal of a high level and the voltage responsive to this high level is applied to the base of the transistor 23. As a result, the transistor 23 is made ON and hence the potential at the input terminal 18 of the control and drive circuit 16 becomes, for example, −1 V as described previously. Then, the drive transistor 35 in the control and drive circuit 16 turns to OFF from ON. Accordingly, the excitation of the relay coil 17 is stopped. As a result, the relay contact X₁ which is opened up to now is closed and hence the power amplifier 13 becomes inoperative. At the same time, the relay contact X₂ is opened to stop the power supply to the speaker.

By the manner set forth above, upon the generation of high frequency oscillation, the power amplifier 13 and speaker can be prevented from being damaged.

As described above, according to the protective circuit for the power amplifier of the present invention, a high frequency signal exceeding the audio frequency range is detected by the high frequency signal detector 15, the control and drive circuit 16 stops the power supply to the relay coil 17 based upon the detected output and hence the power amplifier 13 is made inoperative. Thus, the power amplifier 13 can be avoided from the damage upon the generation of high frequency oscillation.

Further, according to the example of the invention shown in FIG. 3, a part of the ordinary IC protective circuit is used as the control and drive circuit 16, so that the circuit construction does not become so complicated.

The above description is given on preferred embodiments of the invention, but it will be apparent that many modifications and variations could be effected by one skilled in the art without departing from the spirits or scope of the novel concepts of the invention, so that the scope of the invention should be determined by the appended claims only.

I claim as my invention:

1. A protective circuit for use with a plurality of audio amplifiers, a plurality of loads and a system selector including first and second changeover switches, said first changeover switch being connected between a plurality of signal sources and said plurality of audio amplifiers and said second changeover switch being connected between said plurality of audio amplifiers and said plurality of loads said protective circuit comprising:
    (a) an input terminal connected to an output terminal of at least one of said plurality of audio amplifiers to be protected and supplying an output signal to one of said plurality of loads;
    (b) a high frequency signal detector connected to said input terminal for detecting a high frequency signal which is higher in frequency than the audio frequency range and caused by an oscillation loop including said one of audio amplifiers and the first and second changeover switches of said system selector and producing a first control signal when said high frequency signal exceeds a predetermined value;
    (c) control and driving means supplied with said first control signal from said high frequency signal detector; and protective means controlled by the output of said control and driving means so as to disconnect the connection between said output terminal of said one audio amplifier and said one load.

2. A protective circuit according to claim 1, in which said high frequency signal detector comprises a high pass filter having input and output, the input thereof being connected to said output terminal of said one audio amplifier; a rectifier having input and output, the input thereof being connected to the output of said high pass filter; a capacitor connected between the output of said rectifier and a reference point; and a first switching transistor having control, common and output electrodes, the control and common electrodes of which are connected across said capacitor and the output electrode of which produces said first control signal.

3. A protective circuit according to claim 2, further including a power supply, a voltage detecting means for detecting a voltage when a power supply becomes ON and for producing a second control signal and said second control signal connected to the input of said control and driving means.

4. A protective circuit according to claim 3, in which said control and driving means includes at least a second switching transistor having control and output electrodes, the control electrode being connected to the output electrode of said first switching transistor.

5. A protective circuit according to claim 4, in which said protective means comprises a relay device.

6. A protective circuit according to claim 5, in which said relay device comprises a first relay switch and a relay coil, said first relay switch being connected between said output terminal of said one audio amplifier and said load and being controlled by said relay coil which is connected between a DC voltage source and the output electrode of said second switching transisor.

7. A protective circuit according to claim 6, further including a second relay switch, a pre-amplifier, said second relay switch connected between the output of said pre-amplifier and said reference point and controlled by said relay coil.

* * * * *